(12) United States Patent
Plissonnier et al.

(10) Patent No.: US 7,488,536 B2
(45) Date of Patent: Feb. 10, 2009

(54) COATING FOR A MECHANICAL PART, COMPRISING AT LEAST ONE HYDROGENATED AMORPHOUS CARBON, AND METHOD OF DEPOSITING ONE SUCH COATING

(75) Inventors: Marc Plissonnier, Eybens (FR); Frédéric Gaillard, Voiron (FR); Stéphanie Thollon, Saint-Nizier-du-Moucherotte (FR)

(73) Assignee: Commissariat A L'Energie Atomique, Paris (FR)

( * ) Notice: Subject to any disclaimer, the term of this patent is extended or adjusted under 35 U.S.C. 154(b) by 369 days.

(21) Appl. No.: 10/560,776

(22) PCT Filed: Jun. 15, 2004

(86) PCT No.: PCT/FR2004/001486

§ 371 (c)(1),
(2), (4) Date: Dec. 14, 2005

(87) PCT Pub. No.: WO2004/113586

PCT Pub. Date: Dec. 29, 2004

(65) Prior Publication Data

US 2006/0134424 A1 Jun. 22, 2006

(30) Foreign Application Priority Data

Jun. 16, 2003 (FR) .................... 03 07221

(51) Int. Cl.
*B32B 9/00* (2006.01)
(52) U.S. Cl. ..................... 428/408
(58) Field of Classification Search ................. 428/408, 428/698; 427/29.1
See application file for complete search history.

(56) References Cited

U.S. PATENT DOCUMENTS

| 5,900,289 A | 5/1999 | Hartmann et al. |
| 2004/0160672 A1 * | 8/2004 | Phillips ............. 359/588 |

FOREIGN PATENT DOCUMENTS

WO    WO 00/47290    8/2000

\* cited by examiner

*Primary Examiner*—Keith D Hendricks
*Assistant Examiner*—Daniel Miller
(74) *Attorney, Agent, or Firm*—Oliff & Berridge, PLC

(57) ABSTRACT

A coating for a mechanical part comprises a first layer of hydrogenated amorphous silicon carbide designed to be in contact with the mechanical part, a stack of layers and an external layer of hydrogenated amorphous carbon. The stack is formed by an alternation of layers respectively of hydrogenated amorphous carbon and of hydrogenated amorphous silicon carbide. The coating has a total thickness preferably comprised between 10 and 20 micrometers.

11 Claims, 1 Drawing Sheet

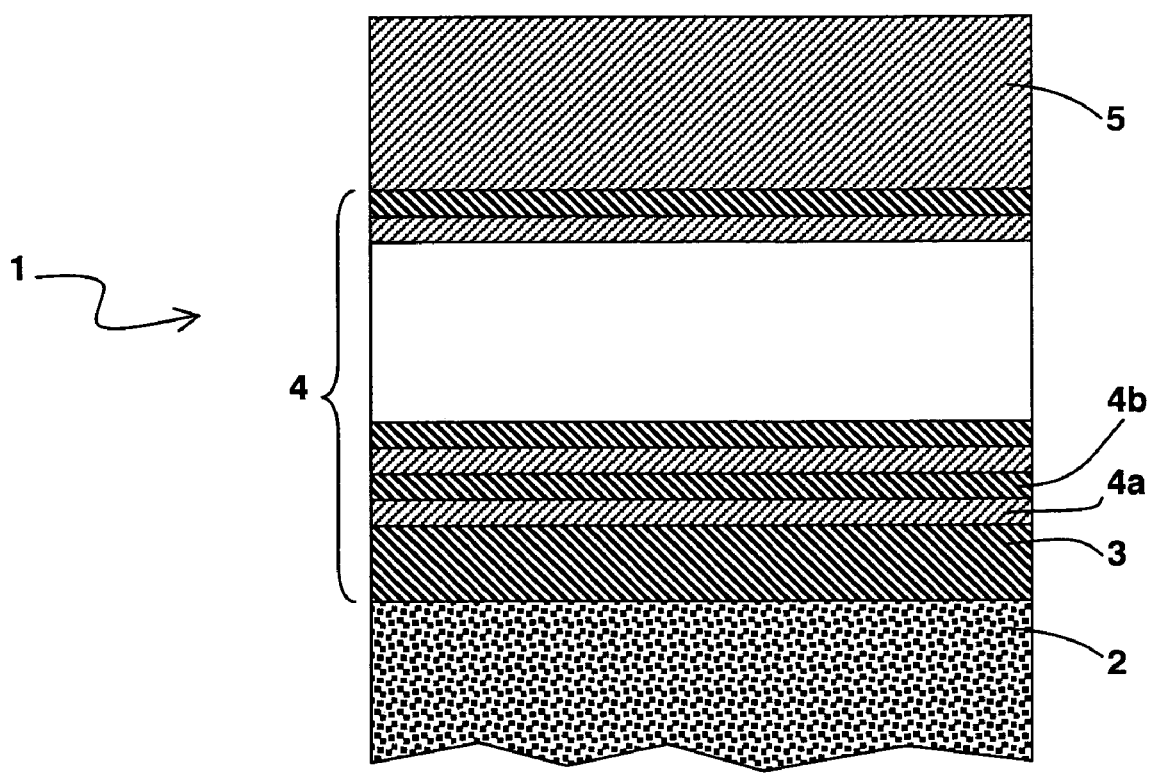
Single figure

COATING FOR A MECHANICAL PART, COMPRISING AT LEAST ONE HYDROGENATED AMORPHOUS CARBON, AND METHOD OF DEPOSITING ONE SUCH COATING

BACKGROUND OF THE INVENTION

The invention relates to a coating for a mechanical part comprising at least one external layer of hydrogenated amorphous carbon.

STATE OF THE ART

To improve the resistance of mechanical parts to wear and friction, it is possible to coat them with a film of hydrogenated amorphous carbon, also called DLC (Diamond Like Carbon). Hydrogenated amorphous carbon does in fact present a very great hardness, a high Young's modulus, and the friction and wear coefficients are extremely low. In addition, the hydrogenated amorphous carbon film presents a small roughness and a low porosity and it has a low surface energy.

However, the hydrogenated amorphous carbon film presents very high intrinsic stresses, of some several GPa. As these high stresses may have an adverse effect on the adhesion of the film to a mechanical part, in particular a steel part, they do not enable depositions with a thickness of more than 5 micrometers to be performed. Moreover, hydrogenated amorphous carbon has a relatively low thermal stability, which prevents a DLC coating being used for temperatures higher than 250° C. The friction coefficient of DLC also increases according to the humidity content in the atmosphere. For example, the friction coefficient of a hydrogenated amorphous carbon film deposited on steel increases gradually from 0.05 in a dry atmosphere to 0.3 in an atmosphere with 100% humidity.

It has been attempted to improve the properties of DLC by doping it with metallic or non-metallic elements. Thus, adding 10 to 20% atomic of silicon in hydrogenated amorphous carbon enables the internal stresses to be reduced to a value close to 1 GPa, without however significantly increasing the friction coefficient. In addition, adding silicon increases the thermal stability of the DLC film while reducing the dependence of the friction coefficient with respect to the humidity content.

Patent application WO-A-00/47290 proposes adding silicon atoms in a DLC layer so as to modify the colour of the coating, by diluting the carbon concentration. Thus, a composite decorative coating for a metallic substrate, with a total thickness comprised between 1 and 25 µm, comprises at least a first layer, with a thickness of 0.1 to 15 µm, of hydrogenated amorphous carbon doped by silicon in a proportion of 2 to 40% atomic. The coating can also comprise an additional layer comprising layers of silicon-doped hydrogenated amorphous carbon and hydrogenated amorphous carbon, with a thickness greater than or equal to 0.5 µm. The silicon-doped hydrogenated amorphous carbon layer does however have a structure close to that of hydrogenated amorphous carbon, the presence of the silicon atoms in the DLC causing formation of Si—H bonds designed to limit the formation of $sp^2$ type C—C bonds as compared with $sp^3$ type C—C bonds.

Likewise, adding a metallic dopant such as tantalum, tungsten, titanium, niobium or zirconium enables the intrinsic stresses and the dependence of the friction coefficient with respect to the humidity content to be reduced. Adding silicon, boron, fluorine, oxygen or nitrogen also enables the surface energy to be influenced.

It is also possible to remedy the defects of non-doped hydrogenated amorphous carbon by performing deposition of a composite material formed by hydrogenated amorphous carbon and amorphous silicon oxide. The composite material has reduced intrinsic stresses with respect to hydrogenated amorphous carbon alone, which enables a better adhesion of the film to be obtained to numerous materials constituting the part to be protected. In addition, the thermal stability is improved and the friction coefficient is reduced. However, the hardness of the composite material is lower than that of hydrogenated amorphous carbon alone.

This type of coating is however not easy to implement, in particular for mechanical parts having a complex shape. As the intrinsic stresses of hydrogenated amorphous carbon are high, coatings with a thickness larger than 5 micrometers are not able to be achieved, which may limit the performances of the coatings. Furthermore, making a deposition of doped or non-doped hydrogenated amorphous carbon, or a deposition constituted by a composite material containing hydrogenated amorphous carbon, can not be performed at low temperature. Implementation of such a deposition may also be long and costly to obtain anti-wear, anti-friction and thermal stability properties which may be not enough satisfactory in certain types of application.

OBJECT OF THE INVENTION

It is an object of the invention to achieve a coating able to adhere perfectly to a mechanical part able to have any type of shape, able to be thermally stable at high temperatures, preferably greater than 250° C., and having, in particular, good anti-wear and anti-friction properties.

According to the invention, this object is achieved by the fact that the coating is formed by a first layer of hydrogenated amorphous silicon carbide designed to be in contact with the mechanical part, a stack formed by an alternation of layers respectively of hydrogenated amorphous carbon and hydrogenated amorphous silicon carbide being arranged between the first layer and the external layer.

According to a development of the invention, the total thickness of the coating is comprised between 10 and 20 micrometers.

According to a preferred embodiment, the thickness of the first layer is comprised between 150 and 300 nanometers.

According to another feature of the invention, the thickness of the external layer is comprised between 0.5 and 2 micrometers.

It is a further object of the invention to provide a method of depositing a coating for a mechanical part that is easy to implement, inexpensive and able to be performed at low temperature.

According to the invention, this object is achieved by the fact that the method consists in depositing, successively, in a same plasma enhanced chemical vapour deposition enclosure:

a first layer of hydrogenated amorphous silicon carbide,
an alternation of layers respectively of hydrogenated amorphous carbon and hydrogenated amorphous silicon carbide,
and an external layer of hydrogenated amorphous carbon.

BRIEF DESCRIPTION OF THE DRAWINGS

Other advantages and features will become more clearly apparent from the following description of particular embodiments of the invention given as non-restrictive examples only and represented in the single accompanying drawing.

The single FIGURE unique is a schematic representation, in cross-section, of a coating for a mechanical part according to the invention.

DESCRIPTION OF PARTICULAR EMBODIMENTS

As represented in the single FIGURE, a coating 1, preferably having a total thickness comprised between 10 and 20 micrometers, is deposited on a mechanical part 2 so as to protect the surface of the part 2 against wear and against friction. The coating 1 comprises a first layer 3 of hydrogenated amorphous silicon carbide, a stack of layers 4 and an layer external 5 of hydrogenated amorphous carbon (DLC). The first layer 3 is arranged on the surface of the mechanical part 2 and preferably has a thickness comprised between 150 and 300 nanometers whereas the external layer 5 made from hydrogenated amorphous carbon has a thickness comprised between 0.5 and 2 micrometers. What is meant by hydrogenated amorphous silicon carbide, also noted SiC:H or a-$Si_{1-x}C_x$:H, x preferably being about 0.5, is an amorphous silicon carbide compound in which a smaller proportion of hydrogen than the proportions of silicon and carbon is incorporated. Such a compound does not comprise any C—C type bonds but only Si—C, Si—H and C—H type bonds.

The stack 4 is formed by an alternation of two layers 4a and 4b, respectively of hydrogenated amorphous carbon (DLC) and of hydrogenated amorphous silicon carbide (SiC:H or a-$Si_{1-x}C_x$). In the stack 4, each layer 4a of hydrogenated amorphous carbon preferably has a thickness comprised between 10 and 150 nanometers whereas each layer 4b of hydrogenated amorphous silicon carbide preferably has a thickness comprised between 5 and 50 nanometers. The stack thus comprises a very large number of layers, preferably comprised between 400 and 1000.

Such a coating, due to its thickness and structure, enables very high mechanical performances to be obtained and in particular very high resistances to wear and friction compared with a coating comprising a single layer of hydrogenated amorphous carbon only. In addition, hydrogenated amorphous silicon carbide is known to be a thermal insulator. Thus, the layers 4b and 2, made from hydrogenated amorphous silicon carbide, thermally protect the adjacent layers 4a and 5, made from hydrogenated amorphous carbon, that are not thermally stable for temperatures greater than 250° C.

Such a coating can therefore be deposited on a mechanical part designed to be subjected to temperatures of more than 250° C., such as engine pistons for example and in particular those used in Formula 1. The amorphous silicon carbide also enables the adhesion of the coating to the mechanical part to be improved and the layers forming the coating are particularly dense, homogeneous and adherent to one another.

Such a coating also presents the advantage of being implemented easily and quickly. Thus, to perform deposition of such a coating on a mechanical part, the layers are preferably deposited successively by a same Plasma Enhanced Chemical Vapour Deposition or PECVD process, in a same enclosure and preferably at low frequency. This enables in particular depositions to be made on mechanical parts having large dimensions and/or a complex geometry.

Thus, in a particular embodiment, the mechanical part whose surface is designed to be protected is previously cleaned and arranged in a plasma enhanced chemical vapour deposition enclosure. The surface of the mechanical part is then subjected to an ionic stripping consisting in ionizing an inert gas such as argon to form positive ions designed to be bombarded at the surface of the part to strip the latter. The first layer made of hydrogenated amorphous silicon carbide is deposited, in a vacuum, by PECVD, as are the layers forming the stack and the external layer of hydrogenated amorphous carbon. Thus, the limit vacuum reached before deposition of the first layer is about $10^{-3}$ mbars and the pressure in the enclosure during deposition of the layers is comprised between 0.05 mbars and 0.5 mbars. Successive PECVD of the different layers is preferably controlled and monitored by any known type of computer means so that the thickness of each layer can be controlled.

The hydrogenated amorphous silicon carbide layers are preferably achieved by PECVD, using tetramethylsilane (Si$(CH_3)_4$) diluted in hydrogen or a gas mixture comprising silane and methane ($SiH_4$ and $CH_3$) as precursor. Using such precursors does in fact enable a stoichiometric hydrogenated amorphous silicon carbide compound (a-$Si_{1-x}C_x$:H with x=0.5) to be obtained. As indicated in the article by J. Huran ("Properties of amorphous silicon carbide films prepared by PECVD", Vacuum, Vol 47, n°10, pages 1223 to 1225/1996), such a compound only has covalent Si—C, C—H and Si—H bonds, already present in the precursor and therefore no C—C bonds. Hydrogenated amorphous silicon carbide must therefore not be structurally mistaken for a silicon-doped hydrogenated amorphous carbon, comprising, in particular, $sp^2$ and $sp^3$ type C—C bonds.

Successively performing deposition of the different layers of the coating in the same PECVD enclosure enables the coating to be achieved by a single deposition process at low temperature. This enables the quality of the interfaces between two adjacent layers to be controlled and depositions of layers having a very small thickness to be made. Moreover, this enables a perfect alternation of layers of hydrogenated amorphous carbon and of hydrogenated amorphous silicon carbide to be achieved.

For example, first and second coatings A and B have been achieved by such a deposition method.

Thus, a first coating A comprises a first layer 3 of SiC:H with a thickness of 225 nm, a stack 4 comprising an alternation of 240 layers of DLC and 240 layers of SiC:H and an external layer 5 of DLC with a thickness of 1 micrometer. In the stack 4, each of the layers of DLC of the stack has a thickness of 150 nm, whereas each of the layers of SiC:H has a thickness of 50 nm.

A second coating B comprises a first layer 3 of SiC:H with a thickness of 195 nm, the stack 4 comprises an alternation of 490 layers of DLC and 490 layers of SiC:H and lathe external layer 5 of DLC has a thickness of 1 micrometer. In the stack 4, each of the layers of DLC of the stack has a thickness of 15 nm, whereas each of the layers of SiC:H has a thickness of 5 nm.

The results of mechanical tests carried out on the first and second coatings A and B, as well as on a coating $C_{ref}$ only comprising a layer of hydrogenated amorphous carbon with a thickness of 2 micrometers are set out in the table below:

| | Tribological tests | | Nano-indentation tests | |
|---|---|---|---|---|
| | $V_u$ = volume of wear in $mm^3 \cdot N^{-1} \cdot m^{-1}$ µ = friction coefficient | | Micro-hardness H | |
| Coating | Dry atmosphere | Wet atmosphere | (MPa) | E (GPa) |
| A | µ = 0.053 $V_u = 2.10^{-6}$ | µ = 0.094 $V_u = 7.10^{-7}$ | 20000 | 180 |
| B | µ = 0.038 $V_u = 8.10^{-6}$ | µ = 0.088 $V_u = 5.10^{-7}$ | 18000 | 140 |

-continued

| | Tribological tests | | Nano-indentation tests | |
|---|---|---|---|---|
| | $V_u$ = volume of wear in mm$^3$·N$^{-1}$·m$^{-1}$ $\mu$ = friction coefficient | | Micro-hardness H | |
| Coating | Dry atmosphere | Wet atmosphere | (MPa) | E (GPa) |
| $C_{ref}$ | $\mu$ = 0.063 $V_u$ = 4.10$^{-8}$ | $\mu$ = 0.122 $V_u$ = 2.10$^{-5}$ | 21000 | 190 |

The volume of wear $V_u$ is measured by profilometry.

It is observed that the micro-hardness of the coatings A and B is slightly lower than that of the coating $C_{ref}$ of DLC but the coatings A and B present a good compromise between a good micro-hardness and a low friction coefficient in a dry atmosphere and in a wet atmosphere, unlike the coating $C_{ref}$ which presents a friction coefficient varying greatly according to the humidity content.

Up to now, industrial application of hydrogenated amorphous carbon as coating was limited by the too large compromise that had to be made between the friction coefficient and the micro-hardness. The coating according to the invention therefore enables this drawback to be overcome by guaranteeing both a low friction coefficient and a good micro-hardness. Furthermore, the behaviour of the coatings A and B in a wet atmosphere is better than that of the coating $C_{ref}$.

Such a coating, formed by successive stacking of layers respectively of hydrogenated amorphous silicon carbide and of hydrogenated amorphous carbon and comparable to a superposition of sheets of very small thickness of hydrogenated amorphous silicon carbide and of hydrogenated amorphous carbon, enables a very good adhesion to a mechanical part, improved anti-wear and anti-friction characteristics and a good thermal stability at high temperatures to be obtained.

The invention claimed is:

1. Coating for a mechanical part comprising:
    a first layer of hydrogenated amorphous silicon carbide designed to be in contact with the mechanical part,
    a stack formed by an alternation of layers respectively of hydrogenated amorphous carbon and hydrogenated amorphous silicon carbide
    and an external layer of hydrogenated amorphous carbon, the stack being arranged between the first layer and the external layer.

2. Coating according to claim 1, wherein the coating has a total thickness comprised between 10 and 20 micrometers.

3. Coating according to claim 1, wherein the first layer has a thickness comprised between 150 and 300 nanometers.

4. Coating according to claim 1, wherein the external layer has a thickness comprised between 0.5 and 2 micrometers.

5. Coating according to claim 1, wherein each of the layers of hydrogenated amorphous silicon carbide of the stack has a thickness comprised between 5 and 50 nanometers.

6. Coating according to claim 1, wherein each of the layers of hydrogenated amorphous carbon of the stack has a thickness comprised between 10 and 150 nanometers.

7. Coating according to claim 1, wherein the stack comprises a number of layers comprised in between 400 and 1000.

8. Method of depositing a coating for a mechanical part according to claim 1, consisting in depositing, successively, in a same plasma enhanced chemical vapour deposition enclosure:
    a first layer of hydrogenated amorphous silicon carbide,
    an alternation of layers respectively of hydrogenated amorphous carbon and hydrogenated amorphous silicon carbide,
    and an external layer of hydrogenated amorphous carbon.

9. Method of depositing according to claim 8, wherein the pressure in the enclosure, when deposition of the layers is performed, is comprised between 0.05 mBar and 0.5 mBar.

10. Method of depositing according to claim 8, wherein the mechanical part is previously cleaned and is subjected to an ionic stripping.

11. Coating according to claim 2, wherein the first layer has a thickness comprised between 150 and 300 nanometers.

* * * * *